United States Patent [19]

El Gamal et al.

[11] Patent Number: 5,015,885

[45] Date of Patent: * May 14, 1991

[54] RECONFIGURABLE PROGRAMMABLE INTERCONNECT ARCHITECTURE

[75] Inventors: Abbas El Gamal, Palo Alto; Steve S. S. Chiang, Saratoga, both of Calif.

[73] Assignee: Actel Corporation, Sunnyvale, Calif.

[ * ] Notice: The portion of the term of this patent subsequent to Jul. 19, 2005 has been disclaimed.

[21] Appl. No.: 309,306

[22] Filed: Feb. 10, 1989

Related U.S. Application Data

[63] Continuation-in-part of Ser. No. 195,728, May 18, 1988, which is a continuation-in-part of Ser. No. 909,261, Sep. 19, 1986, Pat. No. 4,758,745.

[51] Int. Cl.$^5$ .............................................. H03K 17/687
[52] U.S. Cl. ..................................... 307/465; 307/450; 340/825.91
[58] Field of Search ................. 307/450, 465, 468–469, 307/584–585; 340/825.87, 825.91

[56] References Cited

U.S. PATENT DOCUMENTS

| | | | |
|---|---|---|---|
| 4,495,427 | 1/1985 | Cartwright, Jr. | 307/469 |
| 4,670,749 | 6/1987 | Freeman | 307/465 X |
| 4,772,811 | 9/1988 | Fujioka et al. | 307/465 |
| 4,774,421 | 9/1988 | Hartmann et al. | 307/468 X |
| 4,786,904 | 11/1988 | Graham, III et al. | 307/465 X |

*Primary Examiner*—David Hudspeth
*Attorney, Agent, or Firm*—Lyon & Lyon

[57] ABSTRACT

A user-programmable interconnect architecture, which may be used for logic arrays for digital and analog system design, is disclosed. In one embodiment, a plurality of logic cells or modules in a matrix are connected by vertical and horizontal wiring channels. The wiring channels may in turn by programmed by the user to interconnect the various logic cells to implement the required logic function. The wiring channels comprise wiring segments connected by normally open reconfigurable programmable elements situated at the intersection of any two segments to be connected. Sensing circuitry and wiring may be included to allow 100% observability of internal circuit nodes, such as module outputs, from an external pad interface.

39 Claims, 5 Drawing Sheets

RECONFIGURABLE PROGRAMMABLE INTERCONNECT ARCHITECTURE

This application is a continuation in part of co-pending application Ser. No. 195,728, filed May 18, 1988, which is a continuation in part of application Ser. No. 909,261, filed Sept. 19, 1986, now U.S. Pat. No. 4,758,745.

BACKGROUND OF THE INVENTION

1. Field of the Invention

The present invention relates to integrated circuit (IC) technology. More specifically, the present invention pertains to user-configurable interconnections for array logic and other circuitry and such interconnections which may be reconfigurable by the user; i.e., which may be programmed more than once.

2. The Prior Art

An integrated circuit uses a network of metal interconnects between the individual semiconductor components which are patterned with standard photolithographic processes during wafer fabrication. Multiple levels of metalized patterns may be used to increase the flexibility of the interconnects. In Very Large Scale Integration, for example, higher density and more complex wiring networks are needed.

It has long been recognized that a user-programmable interconnect technique or manufacturer programmability just prior to shipment would allow lower tooling costs and faster delivery time. One technique to accomplish this uses lasers to make or break pre-patterned metal interconnects between an array of logic cells. This is usually performed on the finished wafer prior to assembly or actually in an open package. Another approach uses an array of uncommitted interconnect metal lines using anti-fuses consisting of an amorphous silicon alloy sandwiched into insulation holes between third and fourth metal layers to provide electrically programmable links. A different anti-fuse approach is disclosed in co-pending application Ser. No. 909,261, filed Sept. 19, 1986, now U.S. Pat. No. 4,758,745, assigned to the same assignee as the present application.

Such interconnect systems may be used in analog or digital integrated circuits fabricated using bipolar, MOS or other semiconductor technologies. The laser approach requires sophisticated programming equipment and is fairly slow, requiring many hours to pattern one device having a complexity of two-three thousand circuit elements. Some of techniques for electrically programmable techniques are not silicon efficient, have inflexible connectivity or have degraded speed performance. In addition, prior art anti-fuse architectures are only one-time programmable; they cannot be reconfigured.

A gate array circuit is an array of uncommitted gates with uncommitted wiring channels. To implement a particular circuit function, the circuit is mapped into the array and the wiring channels and appropriate connections are mask programmed by the IC gate array vendor to implement the necessary wiring connections that form the circuit function. The gate array vendor then fabricates the circuit according to the constructed masks. Gate arrays are therefore mask programmable and not user programmable.

User-programmable logic arrays are widely used in digital system design in implementing many logic functions and replacing transistor-transistor logic (TTL) parts. Logic arrays currently available include PLA (Programmable Logic Arrays), FPLAs (Field Programmable Logic Arrays), EPLDs (Erasable Programmable Logic Devices) and logic cell arrays using RAM (Random Access Memory) cells to define logic cell function and interconnect configuration. Programmable logic circuit arrays have usually been implemented in bipolar technology using fusible links which, when programmed, define the logic function to be implemented. An example of such a link is the polysilicon fuse which is "programmed" when it is blown and prevents current flow in a circuit. Such fusible links often require large current to operate and require extra area on the IC. The RAM-implemented logic cell array offers more flexibility than the above programmable circuits due to the nature of the array, its logic blocks, and the interconnect capability. However, it has several disadvantages. First, the RAM-implemented interconnect method uses MOS transistors that are costly in area and slow down the performance. Additionally, RAM cell transistors are volatile and will deprogram when power is disconnected. Furthermore, the use of RAM cells to define the logic block function, its architecture and interconnect scheme is very inefficient in area utilization. Finally, configuration information must be loaded from other non-volatile memory devices.

More recently, electrically programmable read-only memory (EPROM) and electrically erasable programmable read-only memory (EEPROM) technology has been used to construct programmable logic circuit arrays In the latter case, EPROM or EEPROM cells are programmed and the stored values used to define circuit configuration. Example of prior art programmable logic circuits which utilize EPROM or EEPROM cells include U.S. Pat. No. 4,207,556 to Spilling et al., U.S. Pat. No. 4,433,331 to Kollaritsch, U.S. Pat. No. 4,609,986 to Harthiann et al., U.S. Pat. No. 4,617,479 to Hartmann et al., U.S. Pat. No. 4,761,768 to Turner, et al., and U.S. Pat. No. 4,642,487 to Carter.

The scheme disclosed in U.S. Patent 4,207,556 refers to the use of EPROM transistors to make interconnections in a standard AND/OR array but does not disclose or suggest any way to program these devices when they are incorporated into an array.

U.S. Pat. No. 4,433,331 discloses a PLA having an interconnection matrix which may utilize an electrically programmable memory cell as the interconnect mechanism. A variation of the well-known row/column PLA interconnect matrix is taught. The reference discloses use of the standard memory cell consisting of both a memory transistor and a select device are necessary to program each cross-point of the matrix.

U.S. Pat. No. 4,609,986 discloses another variation of the AND/OR plane used in PLA devices, where interconnections may be made using EPROM devices.

U.S. Pat. No. 4,617,479 discloses the use of floating gate transistors in logic blocks. The transistor may be turned off thus disabling the logic block.

U.S. Pat. No. 4,761,768 discloses a programmable logic device which utilizes floating gate EEPROM cells.

U.S. Pat. No. 4,642,487 discloses a scheme wherein transistors make desired connections depending on the state of serial shift registers which control their gates. The shift registers function as the memory elements.

Existing programmable array logic circuits use an AND plane of gates followed by an OR plane of gates to implement a particular logic function. The AND plane is usually user programmable while the OR plane programming is usually fixed. Variations to this architecture include registered outputs of the OR plane, partitioning of the array into smaller AND - OR arrays or macrocells and programmable input/output (I/O) architecture to implement several options of I/O requirements. The RAM implemented logic cell array consists of a matrix of configurable blocks which are programmed to implement a particular logic function by loading an internal RAM with the appropriate data pattern. The array has a network of user-programmable MOS transistors acting as electrical switches as well as vertical and horizontal lines or wires to connect the logic blocks together and to the I/O blocks.

Existing user-programmable array logic circuits described above are useful in implementing certain logic functions but have several disadvantages. First, the use of an AND plane/OR plane combination of gates to implement logic functions is inflexible and is not well suited to the requirements of random logic functions. Second, the utilization factor of such an array is quite low and a large number of gates are wasted. Third, the IC chip area-per-functional capability is usually quite high.

Gate arrays, on the other hand, are more flexible than programmable array logic and much more efficient in their gate utilization and IC chip area utilization. However, their main disadvantage is that they are mask programmable and not user programmable. This results in much higher costs to develop the circuit and its unique mask patterns, and a long turn-around time to order and receive IC chips.

OBJECTS OF THE INVENTION

An object of the invention is to provide a user-programmable circuit with a flexible interconnect architecture that allows the implementation of field programmable semi-custom ICs with high complexity and performance.

An additional object of the invention is to provide an array logic circuit which is more flexible than existing programmable logic circuits, more efficient in gate utilization, and allows 100% observability of any internal logic node from the external pad interface.

A further object of the invention is to provide a user-programmable circuit with a flexible interconnect architecture that allows the implementation of field-programmable, semi-custom integrated circuits which are reconfigurable.

It is also a object of the invention to provide a user programmable array logic circuit that provides the same capabilities and versatility as mask programmed gate arrays with comparable performance characteristics. Other objects and features of the invention will become apparent to those skilled in the art in light of the following description and drawings of the preferred embodiments.

BRIEF DESCRIPTION OF THE INVENTION

In accordance with the present invention, a user programmable and reconfigurable interconnect architecture is disclosed. Many kinds of electrical components or elements, which may be generally referred to as "modules," may be defined and interconnected by this architecture. One logic implementation of the user programmable interconnected architecture consists of a plurality of logic cells or logic modules placed in an array or matrix. The array has a set of vertical wiring channels and a set of horizontal wiring channels that are programmed by the user to interconnect the various logic cells to implement the required logic functions. Additional sensing circuitry and wiring is included to allow 100% observability of internal circuit nodes, such as logic cell outputs, from the external pad interface. This is accomplished by a user-moveable probe which provides access to any internal test point in the array.

The wiring segment and module architecture used in the present invention is disclosed in co-pending application Ser. No. 909,261, now U.S. Pat. No. 4,758,745, previously mentioned, which is expressly incorporated herein by reference. In the present invention, EPROM or EEPROM floating gate transistors are utilized as reconfigurable programmable elements and are referred to collectively herein as "reconfigurable elements".

Connections to the wiring channels are made by an EPROM or EEPROM situated at the intersection of any two wires to be connected. As those of ordinary skill in the art are aware, in its "programmed" state an EPROM or EEPROM will not conduct and in its "erased" state, it will conduct. Initially, all EPROMs are erased and all EEPROMs are programmed. To disallow a connection, the EPROM is programmed or the EEPROM is erased.

To provide more efficient utilization of the wiring channels, a plurality of these reconfigurable elements are used to segment the vertical and horizontal channels into shorter wire lengths. These segments may be joined together to form longer wire connections by erasing the reconfigurable elements or the elements may be left programmed to provide independent segment wire lengths and allow different segments along the same wiring channel position to be used for different circuit connections.

The EPROM and EEPROM floating gate transistors of the present invention are size-optimized for the present invention, using large channel lengths for low on-impedance. Those of ordinary skill in the art will readily recognize that the process of size optimizing the EPROM and EEPROM floating gate transistors of the present invention will depend on the particular circuit application within the circuit being designed. All devices need not be the same size and the device size will be selected in advance by the chip designer and will generally be dictated by an area verses speed trade off. The selection of device size is not a part of the present invention and is well within the skill of one of ordinary skill in the art.

Circuitry for programming and erasing the reconfigurable elements is situated at the edge of the array. Connectivity information is placed into this circuitry, and appropriate voltages are applied to the elements to effect the desired connection patterns. The same vertical and horizontal channels that are used for wiring channels in normal operations may be used for programming and erasing the various reconfigurable elements and to provide complete testing of the array modules and wiring paths.

The logic cell used in the array may be a universal element, which is very efficient in its implementation of random logic functions. These functions may be defined by the use of selected programmable elements.

Further, additional circuitry is included to allow 100% observability of any internal test point, such as logic cell or module outputs, thus providing a user-moveable probe inside the integrated circuit to test internal points from the external interface without having to actually physically probe the internal circuits.

Those skilled in the art will recognize the general applicability of the interconnect architecture disclosed herein to other types of circuits, both analog and digital.

DETAILED DESCRIPTION OF A PREFERRED EMBODIMENT

Although the disclosure of the present invention will be made using the illustrative and presently preferred embodiments of EPROMS and EEPROMS, those of ordinary skill in the art will readily recognize that other elements, having the characteristics necessary for implementation in the present invention, may be used. Such elements are generically referred to herein as "reconfigurable elements", and it is understood that such elements may be thought of as having two main terminals with a switch between them, and that the switch may either be "on", in which case the two main terminals are connected together, or may be "off", in which case the two main terminals are electrically isolated from one another. A "control element", associated with each reconfigurable element determines whether the equivalent switch between the two main terminals is in the on or off position.

When, in the specification and claims herein, a reconfigurable element is recited as "connected between", or "joining", two other elements, or that the two other elements are "joined by" a reconfigurable element, it is intended to mean that one main terminal of the reconfigurable element is connected to one of the elements and the other main terminal of the reconfigurable element is connected to the other of the elements which are "joined" or with respect to which the reconfigurable element are "connected between".

Similarly, within the present specification and claims, when an EPROM memory transistor or an EEPROM memory transistor is "connected between" other circuit elements, and when such memory transistors are recited as "joining" such circuit elements, or they are "joined by" the memory transistors, it is intended to mean that the source of the memory transistor is connected to one of the circuit elements and the drain of the memory transistors connected to the other one of the elements.

Figure 1A:
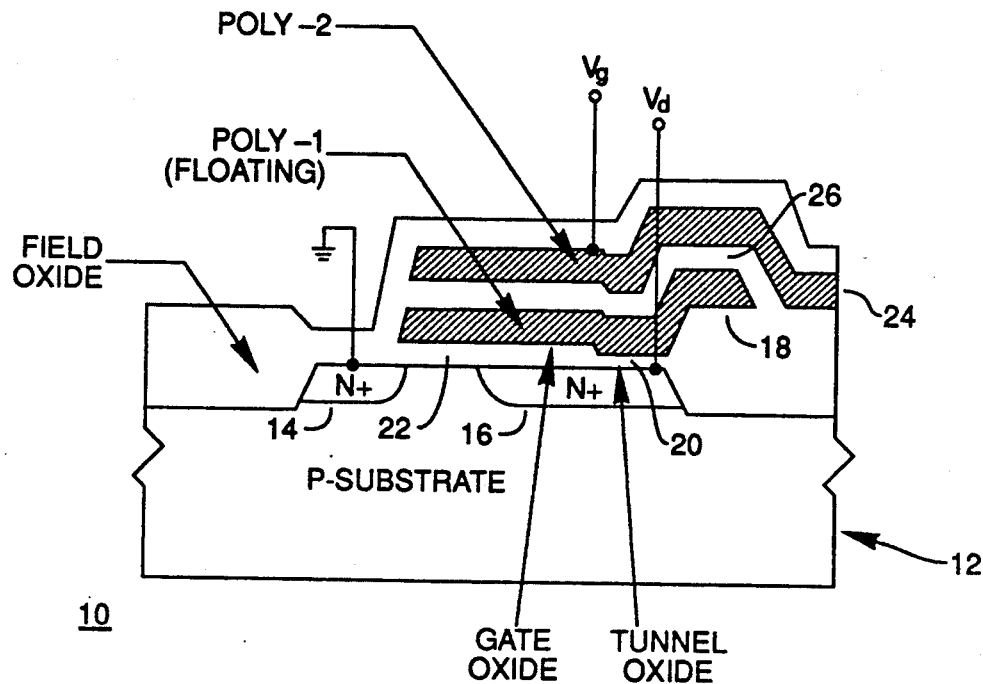
FIG. 1a is a semiconductor profile drawing of a EEPROM memory transistor suitable for use with the present invention.

Referring now to FIG. 1a, a semiconductor profile drawing showing a cross-section of an EEPROM transistor 10 suitable for use in the present invention is shown. EEPROM transistor 10 is shown on a P-type substrate 12 and has implanted source region 14 and drain region 16. Overlying the channel between the source region 14 and drain region 16 is floating gate 18. A portion of floating gate 18 is separated from drain 16 by a thin tunnel dielectric portion 20 of gate oxide 22. Control gate 24 is separated from floating gate 18 by an interpoly dielectric layer 26. Although one transistor is shown in FIG. 1a, it is well understood that two transistors may be used for reliable EEPROM device operation.

The operation of EEPROM transistor 10 is well understood by those of ordinary skill in the art. For example, see *Analysis and Modeling of Floating-Gate EEPROM Cells*, A. Kolodny et al., IEEE Transaction on Electron Devices, Vol. ED-*33*, No. *6*, June, 1986 p. 835, which is expressly incorporated herein by reference.

Figure 1B:
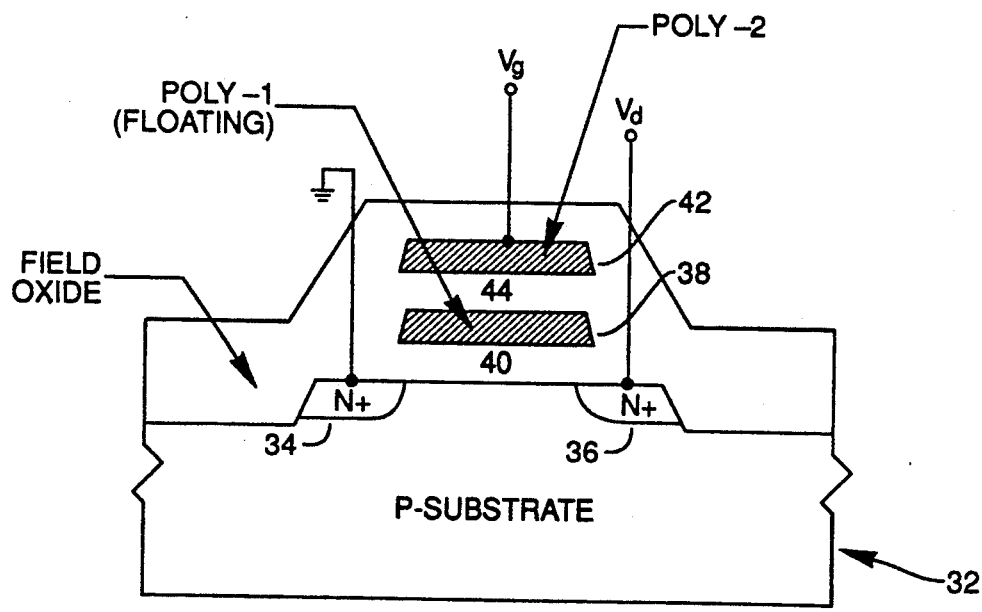
FIG. 1b is a semiconductor profile drawing of a EPROM memory transistor suitable for use with the present invention.

Referring now to FIG. 1b, the semiconductor profile drawing showing a cross section of an EPROM 30 suitable for use in the present invention is shown. EPROM 30 is shown on a P-type substrate 32 and has implanted source region 34 and implanted drain region 36. Overlying the channel region between the source region 34 and the drain region 36 is a floating gate 38. Floating gate 38 is separated from the surface of substrate 32 by an oxide region 40. Above floating gate 38 is control gate 42 separated from control gate 38 by a layer of interpoly dielectric 44.

The operation of EPROM 30 is well understood by those of ordinary skill in the art. For example, see "*Electrically Alterable Avalanche-Injection-Type MOS Read Only Memory With Stacked-gate-structure*", G. Sizuka; et. al., IEEE Trans. Electron. Devices, ED-23, 379 (1976), and "*Physics of Semiconductor Devices*", S.M.Sze, 2nd edition, Wiley-Interscience Publications. 1981, which are expressly incorporated herein by reference.

Figure 2A:
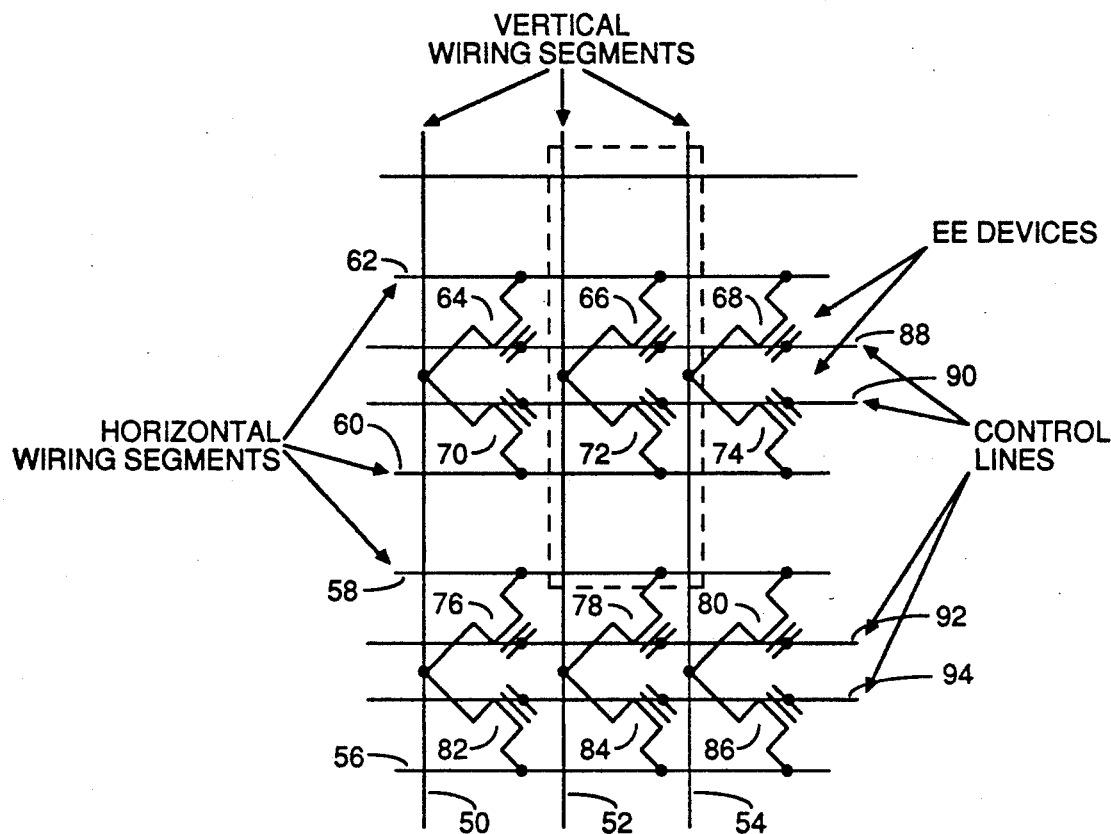
FIG. 2a is a schematic diagram of a presently-preferred embodiment of the interconnect architecture of the present invention showing horizontal and vertical wire segments, reconfigurable EEPROM or EPROM devices as interconnect elements between those segments, and control and programming lines for those elements.

Referring now to FIG. 2a, an arrangement is shown wherein reconfigurable elements comprising either EPROM or EEPROM devices are arranged to connect horizontal and vertical wiring segments. In FIG. 2a, vertical wiring segments 50, 52, and 54 intersect horizontal wiring segments 56, 58, 60 and 62. As is readily understood by those of ordinary skill in the art, this matrix of three vertical wiring segments and four horizontal wiring segments contains 12 intersections. Each of these 12 intersections is connected by a reconfigurable element. Thus, a reconfigurable element 64 is associated with the intersection of vertical wiring segment 50 and horizontal wiring segment 62; a reconfigurable element 66 is associated with the intersection of vertical wiring segment 52 and horizontal wiring segment 62. A reconfigurable element 68 is associated with intersection of vertical wiring segment 64 and horizontal wiring segment 62. A reconfigurable element 70 is associated with the intersection of vertical wiring segment 50 and horizontal wiring segment 60. A reconfigurable element 7 is associated with the intersection of vertical wiring segment 52 and horizontal wiring segment 60. A reconfigurable element 74 is associated with the intersection of vertical wiring segment 54 and horizontal wiring segment 60. A reconfigurable element 76 is associated with the intersection of vertical wiring segment 50 and horizontal wiring segment 58. A reconfigurable element 78 is associated with the intersection of vertical wiring segment 52 and horizontal wiring segment 58. A reconfigurable element 80 is associated with the intersection of vertical wiring segment 54 and horizontal wiring segment 58. A reconfigurable element 82 is associated with the intersection of vertical wiring segment 50 and horizontal wiring segment 58. A reconfigurable element 84 is associated with the intersection of vertical wiring segment 52 and horizontal wiring segment 58. A reconfigurable element 86 is associated with the intersection of vertical wiring segment 54 and horizontal wiring segment 56.

In the embodiment of FIG. 2a, four control lines are used to control reconfigurable elements 64–86. The control gates of all reconfigurable elements which are connected to one horizontal segment and connected to a common control line. Thus, as shown in FIG. 2a, control line 88 is connected to the control gates of reconfigurable elements 64, 66, and 68; control line 90 is connected to the control gates of reconfigurable elements 64, 66, and 68; control line 90 is connected to the control gates of EEPROM devices 70, 72, and 74; control line 92 is connected to the control gates of reconfigurable elements 76, 78, and 80; control line 9 is connected to the control gates of reconfigurable elements 82, 84, and 86.

Figure 2B:
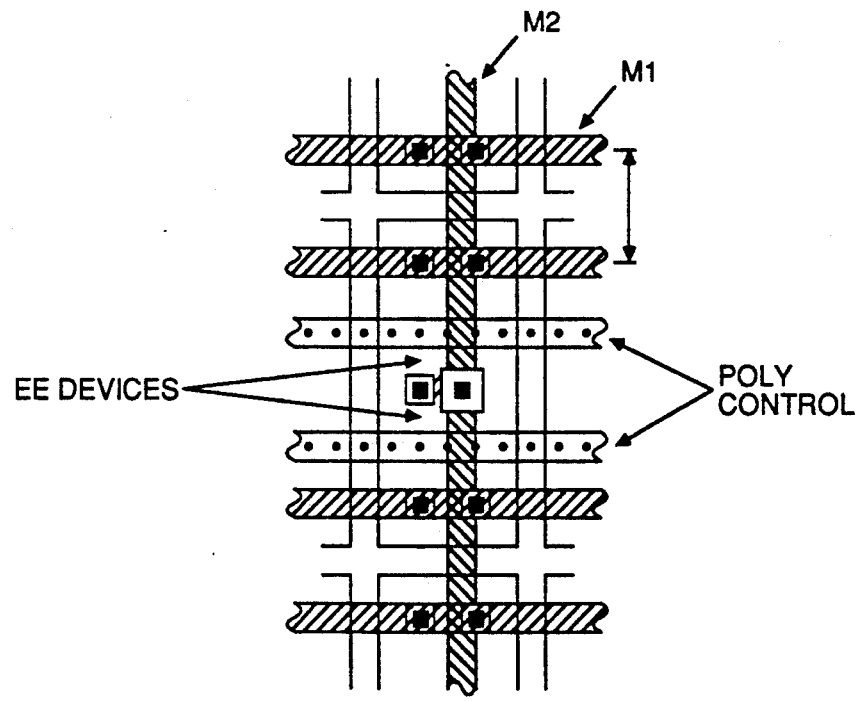
FIG. 2b is a presently-preferred physical layout drawing for the circuitry of FIG. 2a using EEPROM devices.
Figure 2C:
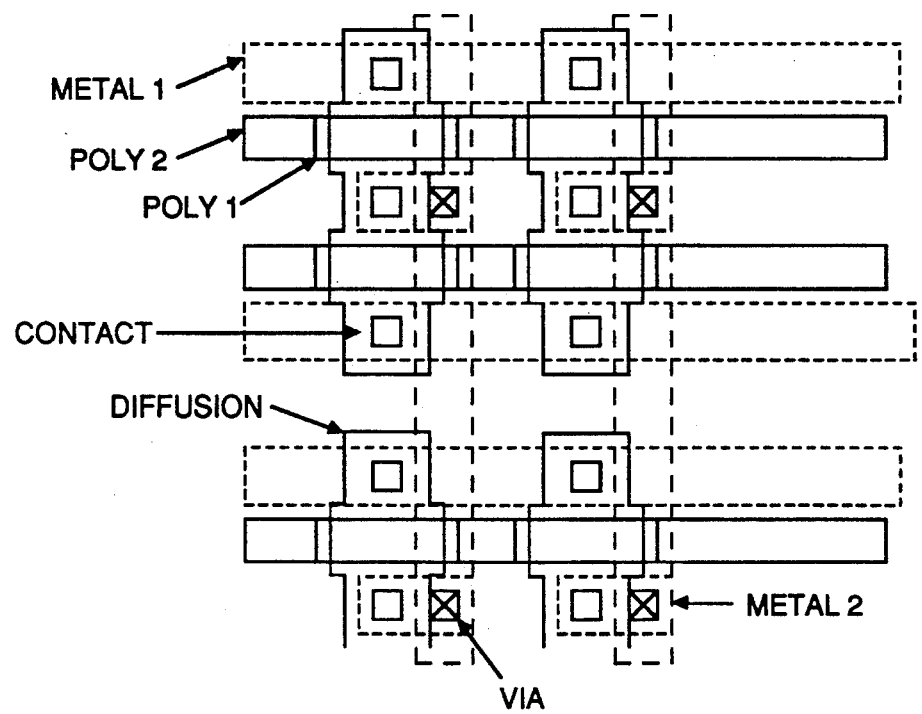
FIG. 2c is a presently preferred physical layout drawing for the circuitry of FIG. 2a using EPROM devices.

In the embodiment of FIGS. 2b and 2c, preferred layouts of EEPROM and EPROM floating gate arrays are presented. These layouts have an advantage over the conventional floating gate array layouts, i.e., no metal 1 is drawn across the top of double poly control gate Consequently, the preferred layouts do not encounter the metal 1 step coverage problem which is one of the major reliability concerns for the conventional floating gate EPROM or EEPROM devices. Instead of metal 1, metal 2 is used and is drawn on top of the floating gate poly (FIG. 2b, 2c). Since planarization scheme has been used extensively before metal 2 and is well known to those of ordinary skill in the double metal process, it does not present any metal 2 step coverage problem.

Figure 3:
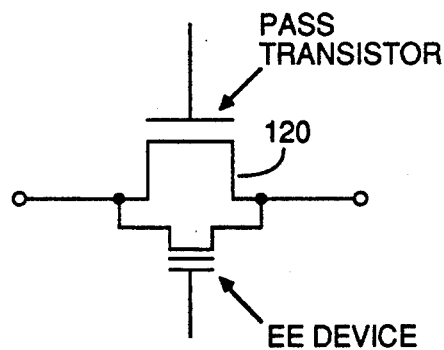
FIG. 3 shows a reconfigurable element in parallel with a series-pass transistor as used in the architecture of the present invention.

Referring now to FIG. 3, a reconfigurable element 10 as used in the present invention is shown shunted by series-pass transistor 120. The function of the series-pass transistors herein are the same as the function of series-pass transistors in U.S. Pat. No. 4,758,745. These series-pass transistors function to enable reconfigurable devices 10 to be programmed. In addition, series-pass transistors, function to allow internal observability of any selected node in the integrated circuit, as disclosed in U.S. Pat. No. 4,758,745.

After a circuit containing EPROM or EEPROM devices as reconfigurable elements between horizontal, vertical, or horizontal and vertical wiring segments has been fabricated, the elements must be configured to implement the circuit desired by the user. The techniques for implementing such circuits are discussed with reference to FIGS. 4 and 5.

In the case of the EPROM, the devices are first erased, i.e., rendered conductive by the use of an ultraviolet-light erase cycle. This is well understood by those of ordinary skill in the art. In a embodiment using EEPROM reconfigurable elements in an architecture such as that described herein, the elements must be first turned off, i.e., rendered non-conductive before configuring any circuits. In the case of the EEPROM, the write operation on the floating-gate is performed during which the floating-gate is charged negatively with electrons. This state is achieved by applying a positive voltage to the control gate while the source, drain and substrate are grounded. The resulting stored negative charge on the floating-gate causes a shift on the threshold voltage of the transistor so that the transistor will not conduct during a read operation. This write cycle is well understood by those of ordinary skill in the art.

After all of the reconfigurable elements on the entire device have been rendered non-conductive(EE-PROMs), or erased (EPROMs), the process for configuring the final circuit may begin.

Figure 4A:
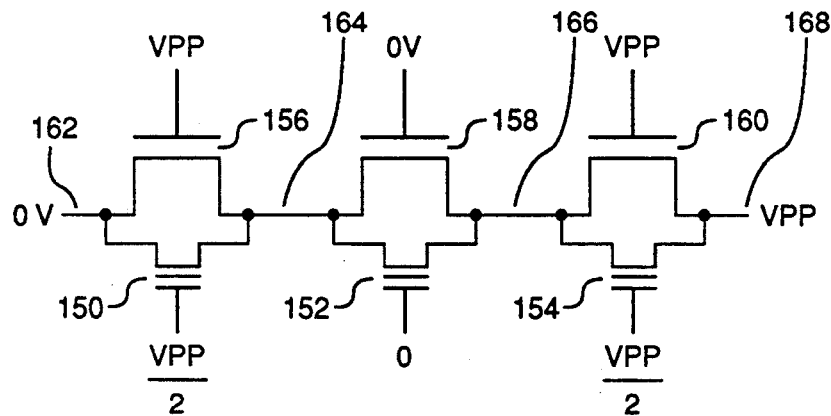
FIG. 4a shows the necessary biasing of the series-pass transistors and EEPROM devices for programming a cross-device between a horizontal and a vertical segment.

Referring now to FIG. 4a, a configuration of EEPROM memory devices 150, 152, and 154 are shown shunted by series-pass transistors 156, 158, and 160. These pass transistor/EEPROM combinations are shown connecting together horizontal wiring segments 162, 164, 166, and 168. Although, for purposes of this discussion, it is assumed that wiring segments 162, 164, 166, and 168 are horizontal wiring segments, those of ordinary skill in the art will readily recognize that the same process applies for vertical wiring segments.

In the example of FIG. 4a, assume that it is desired to activate EEPROM device 152, thus connecting together wiring segments 164 and 166. In this example it is assumed that wiring segments 162 and 168 are located at positions from which they may be biased to the differing voltages, i.e., 0 volts, Vpp/2 volts or Vpp. The means for providing these voltages are adequately disclosed in U.S. Pat. No. 4,758,745 and are, however, well understood by those of ordinary skill in the art.

In order to bring these required voltages to bias the source and drain of EEPROM device 152 correctly, the voltage Vpp, appearing on wiring segment 168, and the 0 volts, appearing on wiring segment 162 must be brought to EEPROM 152. In order to accomplish this, the voltage Vpp is placed on the gates of pass-transistors 156 and 160, allowing the voltage Vpp to appear on wiring segment 166 and thus on the drain of EEPROM 152, and allowing 0 volts to appear on the wiring segment 164, and thus on the source of EEPROM 152. Series-pass transistor 158 is, of course, kept in a non-conducting state. The control-gate of EEPROM 152 is brought to 0 volts. In this condition the EEPROM 152 will be activated. The other EEPROM devices along these wiring segments, EEPROM devices 150 and 152, are not to be activated. Accordingly, an intermediate voltage, such as Vpp/2, is placed on the control-gates of EEPROMS 150 and 154, thus assuring that they will not activate.

Figure 4B:
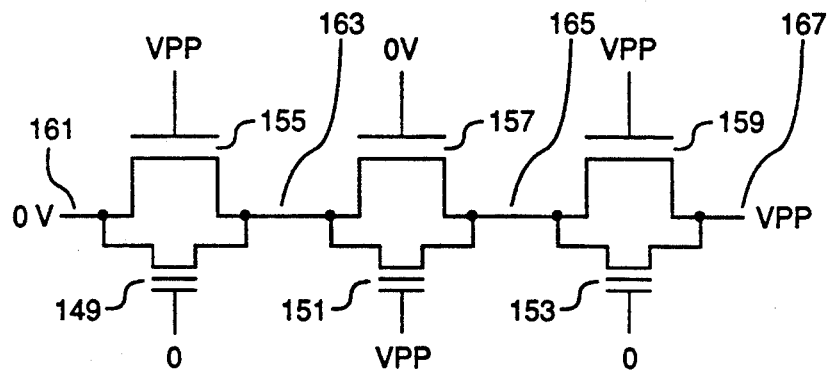
FIG. 4b shows the necessary biasing of the series-pass transistors and EPROM devices for programming a cross-device between a horizontal and a vertical segment.

Referring now to FIG. 4b, the programming of an EPROM device 151, connecting wiring segments 163 and 165 together, is disclosed. In FIG. 4b wiring segments 161, 163, 165 and 167 are connected together by EPROMS 149, 151 and 153. EPROMs 149, 151 and 153 are shunted by series-pass transistors 155, 157 and 159 respectively.

In order to program EPROM 151 to turn it off, series-pass transistors 155 and 159 are turned on by placing Vpp on their gates. Series-pass transistor 157, with zero volts on its gate, is turned off. Zero volts is placed on wiring segment 161 and Vpp is placed on wiring segment 167. Vpp is placed on the control gate of EPROM 151 and zero volts is placed on the gates of EPROMS 149 and 153. Since series pass transistors 155 and 159 are turned on, Vpp is placed on the drain of EPROM 157 and zero volts is placed on its source, thus "programming" it, i.e., turning it off. If left unprogrammed, it will conduct during a read operation.

Figure 5A:
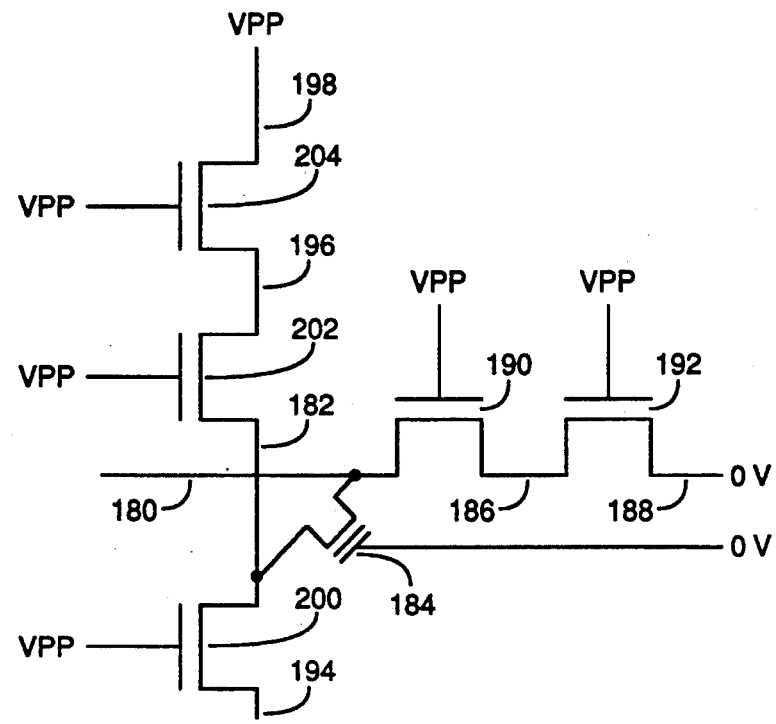
FIG. 5a shows the biasing of the series-pass transistors and EEPROM devices necessary for programming a selected device between two horizontal or two vertical wiring segments.

Referring now to FIG. 5a, the activating of an EEPROM device existing at an intersection of a horizontal and vertical wiring segment, such as one of the devices depicted in FIG. 2a, is shown. Horizontal wiring segments 180 and vertical wiring segment 182 are joined by EEPROM device 184. Horizontal wiring segment 180 may be temporarily joined with horizontal wiring segment 186 and horizontal wiring segment 188 by turning on series pass-transistors 190 and 192 respectively. Vertical wiring segment 182 likewise may be temporarily joined to vertical wiring segments 194, 196 and 198 by activating series-pass transistors 200, 202, 204 respectively.

In the examples of FIGS. 4a–b, it is assumed that horizontal wiring segments 167 and 168 may be connected to a source of programming voltage, as may be vertical wiring segment 198 in FIG. 5a. In order to activate the EEPROM device 182, and thus connect together horizontal wiring segment 180 and vertical wiring segment 182, the source of EEPROM device 184, connected to horizontal wiring segment 182 as well as the gate of EEPROM device 184, must be connected to 0 volts, while the drain of EEPROM device 184, connected to vertical wiring segment 182, must be brought to the programming voltage Vpp. In order to accomplish this, series-pass transistors 190, 192, 202, and 204, are turned on by applying the voltage Vpp to their gates. In this manner, the 0 volts appearing on horizontal wiring segment 188 is applied to the source of EEPROM device 184, and the programming voltage Vpp, appearing on vertical wiring segment 198, is applied to the drain of the EEPROM transistor 184 via wiring segments 196 and 182. Series-pass transistor 200 may be left turned off. 0 volts is simultaneously applied to the control-gate of EEPROM transistor 184, thus activating it and connecting together horizontal wiring segment 180 and vertical wiring segment 182.

Figure 5B:
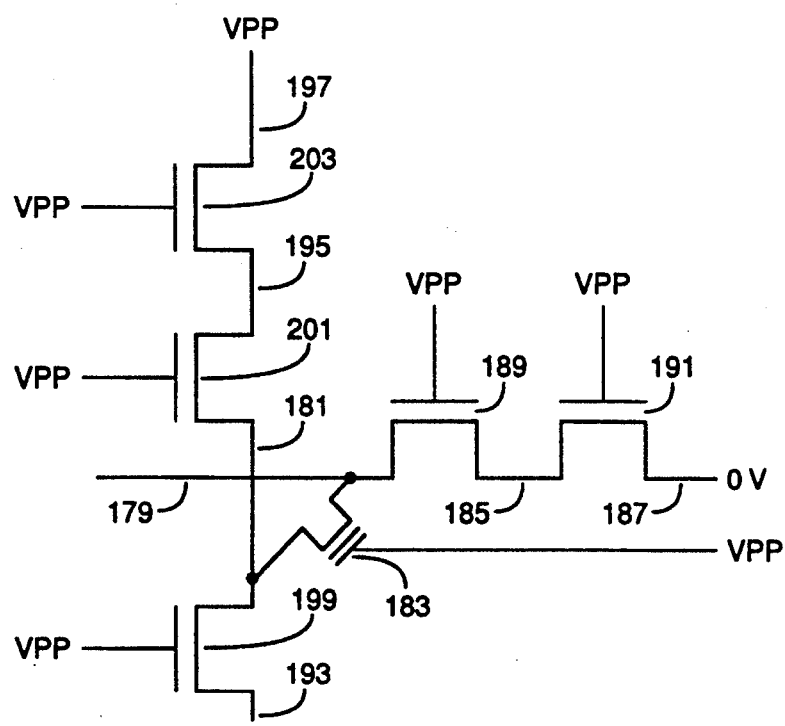
FIG. 5b shows the biasing of the series-pass transistors and EPROM devices necessary for programming a selected device between two horizontal or two vertical wiring segments.

Referring now to FIG. 5b, the programming of EPROM 183 connecting cross wiring segments 179 and 181. In FIG. 5b horizontal wiring segments 179, 185 and 187 are separated by series-pass transistors 189 and 191 and vertical wiring segments 193, 181, 195 and 197 are separated by series-pass transistors 199, 201, and 203. To program EPROM 183 and thus turn it off so it will not conduct, series-pass transistors 189 and 191 are turned on, allowing the zero volts on horizontal wiring segment 187 to appear at the source of EPROM 183. Vpp is placed on the control gate of EPROM 183. Series-pass transistors 201 and 203 are turned on by applying Vpp to their gates, thus passing Vpp, appearing on vertical wiring segment 197, to the drain of EPROM 183.

The control of the programming of the EEPROM devices and EPROM devices of the present invention may be accomplished using the program, test and I/O circuitry disclosed with respect to U.S. Pat. No. 4,758,745. The channel control circuitry decodes information appearing on the I/O pins of the integrated circuit and appropriately steers Vpp, Vpp/2 and 0 volts to the current circuit nodes for programming, erasing, and activating the EEPROM and EPROM transistors of the present invention.

Those of ordinary skill in the art will also recognize that the control gates of the EPROM o the EEPROM devices utilized in the present invention will be set to the voltages that those devices normally see when not being programmed or erased.

Thus, a preferred embodiment of the present invention has been disclosed. Those of ordinary skill in the art will be able to make slight departures from the disclosure herein without departing from the spirit and scope of the invention, which is to be limited only by the scope of the appended claims.

What is claimed is:

1. In an integrated circuit, an electrically programmable interconnect architecture, comprising:
    a plurality of modules placed in an array, the modules having connection nodes,
    a plurality of sets of wiring channels, at least some of said sets of wiring channels having at least one wiring channel comprising at least two wiring segments and wherein at least one of said wiring segments is connected to at least one of said connection nodes,
    a plurality of reconfigurable elements, each of said reconfigurable elements having two main terminals, said main terminals connected between selected ones of said wiring segments comprising one of said channels, each of said reconfigurable elements further including a control terminal,
    configuring means, connected to said control terminals, for selectively rendering said reconfigurable elements conductive or non-conductive between said two main terminals,
    series-pass transistors connecting selected adjacent ones of said segments, each of said series-pass transistors having a control element, and
    selection circuitry connected to the control element of each of said series-pass transistors capable of selectively biasing each one of said series-pass transistors to cause it to conduct or not to conduct.

2. The electrically programmable interconnect architecture of claim 1 wherein at least one of said wiring channels lies in a direction substantially non-parallel to the remainder of said wiring channels and is disposed in a layer electrically isolated from the layer containing said remainder of wiring channels, forming intersections.

3. The electrically-programmable interconnect architecture of claim 2, further comprising:
    reconfigurable elements connected between selected ones of those wiring segments of said sets of wiring channels which intersect each other at said intersections.

4. A user-programmable array logic circuit, comprising:
    a plurality of logic modules placed on a substrate, the logic modules each having connection nodes,
    a plurality of first wiring channels running in a first direction, at least one of which is connected to at least one of said connection nodes, at least one of said plurality of first wiring channels including at least two adjacent wiring segments, a plurality of second wiring channels running in a second direction and disposed in a layer electrically isolated from the layer containing said first wiring channels, intersecting said first wiring channels at at least one intersection, at least one of said plurality of second wiring channels including at least two adjacent wiring segments one of which forms said intersection with one of said wiring segments in said plurality of said first wiring channels, a plurality of reconfigurable elements, each having two main terminals, connected between at least one pair of the intersecting wiring segments series-pass transistors connecting selected adjacent and intersecting ones of said segments, each of said series-pass transistors having a control element, and selection circuitry connected to the control element of each of said series-pass transistors capable of selectively biasing each one of said series-pass transistors to cause it to conduct or not to conduct.

5. The array logic circuit according to claim 4, in which one or more of said wiring channels comprises a series of wiring segments and further including additional ones of said reconfigurable elements having two main terminals connected between adjacent ones of said wiring segments.

6. The array logic circuitry according to claim 4 in which substantially all of said first and second wiring channels comprise a series of wiring segments, each of said wiring segments having a length equal to at least the smaller of the length or width of one logic module.

7. The array logic circuit according to claim 5 in which wiring segments of said first wiring channels have a length equivalent to the length of two logic modules and the wiring segments of said second wiring channels have a length equivalent to the width of three logic modules.

8. The array logic circuit according to claim 5, in which at least two of adjacent ones of said wiring segments forming a wiring channel are joined in series at their ends by series pass transistors having control elements.

9. The logic circuit according to claim 8 further comprising selection circuitry connected to the control element of each series-pass transistor in order to cause said series-pass transistor to conduct or not to conduct current between the wiring segments to which it is electrically connected.

10. The logic circuit according to claim 8 further comprising select transistors electrically connected to a middle wiring segment of each wiring channel which, when biased to conduct, connects the middle wiring segment to a selected potential.

11. The logic circuit according to claim 9 further comprising:

circuitry, connectable to selected ones of said wiring segments by said selection circuitry for providing preselected voltage to cause selected ones of said reconfigurable elements to conduct.

12. The logic circuit according to claim 10 further comprising:

circuitry, connectable to selected ones of said wiring segments by said selection circuitry for providing preselected voltages to cause selected ones of said reconfigurable elements to conduct.

13. A programmable array logic circuit, comprising:

a plurality of logic modules placed in an array, said logic modules each having connection nodes, a plurality of sets of wiring channels, at least one of said wiring channels including at least two wiring segments, at least one wiring segment of one wiring channel connected to at least one of said connection nodes, at least one of said wiring channels being in a direction substantially non-parallel to other ones of said wiring channels, at least two of said wiring segments of at least one of said wiring channels being joined in series by series-pass transistors, at least two of said wiring segments of at least one of said wiring channels being joined in series by reconfigurable elements, at least two of said wiring segments that intersect each other being connected by two main terminals of reconfigurable elements, circuitry connected to said series-pass transistors capable of selectively biasing said series-pass transistors to cause them to conduct or not to conduct.

14. In an integrated circuit, an electrically programmable interconnect architecture, comprising:

a plurality of modules placed in an array, the modules having connection nodes, a plurality of sets of wiring channels, at least some of said sets of wiring channels having at least one wiring channel comprising at least two wiring segments and wherein at least one of said wiring segments in at least one wiring channel is connected to at least one of said connection nodes, a plurality of EPROM memory transistors, each of said EPROM memory transistors having a source and a drain, said source and said drain connected between selected ones of said wiring segments comprising one of said channels, said each of EPROM memory transistors further including a control gate, configuring means, connected to said sources, drains, and control gates of said EPROM memory transistors, for selectively rendering said EPROM memory transistors non-conductive.

15. The electrically programmable interconnect architecture of claim 14 wherein at least one of said wiring channels lies in a direction substantially non-parallel to the remainder of said wiring channels and is disposed in a layer electrically isolated from the layer containing said remainder of wiring channels, forming intersections.

16. The electrically-programmable interconnect architecture of claim 15, further comprising:

EPROM memory transistors joining selected ones of those wiring segments of said sets of wiring channels which intersect each other at said intersections.

17. The electrically-programmable interconnect architecture according to claim 14, further comprising:

series-pass transistors connecting selected adjacent and intersecting ones of said segments, and selection circuitry connected to the control element of each of said series-pass transistors capable of selectively biasing each one of said series-pass transistors to cause it to conduct or not to conduct.

18. A user-programmable array logic circuit, comprising:

a plurality of logic modules placed on a substrate, the logic modules each having connection nodes;

a plurality of first wiring channels running in a first direction, said first wiring channels containing a plurality of wiring segments, at least one of said wiring segments connected to at least one of said connection nodes a plurality of second wiring channels running in a second direction and disposed in a layer electrically isolated from the layer containing said first wiring channels, intersecting said first wiring channels at intersections, a plurality of EPROM memory transistors each having a source and drain connected between at least one pair of the intersecting wiring channels.

19. The array logic circuitry according to claim 18 in which substantially all of said first and second wiring channels comprise a series of wiring segments, each of said wiring segments having a length equal to at least the smaller of the length or width of one logic module.

20. The array logic circuit according to claim 18 in which wiring segments of said first wiring channels have a length equivalent to the length of two logic modules and the wiring segments of said second wiring channels have a length equivalent to the width of three logic modules.

21. The array logic circuit according to claim 18, in which at least two of adjacent ones of said wiring segments forming a wiring channel are joined in series at their ends by series pass transistors having control elements.

22. The logic circuit according to claim 21 further comprising selection circuitry connected to the control element of each series-pass transistor in order to cause said series-pass transistor to conduct or not to conduct current between the wiring segments to which it is electrically connected.

23. The logic circuit according to claim 21 further comprising select transistors electrically connected to a middle wiring segment of each wiring channel which, when biased to conduct, connects the middle wiring segment to a selected potential.

24. The logic circuit according to claim 21 further comprising:
circuitry, connectable to selected ones of said wiring segments by said selection circuitry for providing preselected voltage to program selected ones of said EPROM memory transistors.

25. A programmable array logic circuit, comprising:
a plurality of logic modules placed in an array, said logic modules each having connection nodes,
a plurality of sets of wiring channels, at least one of said wiring channels including a plurality of wiring segments, at least one of said wiring segments in one of said channels connected to at least one of said connection nodes, at least one of said wiring channels being in a direction substantially non-parallel to other ones of said wiring channels,
the wiring segments of at least one of the wiring channels being joined in series by series-pass transistors,
at least two of said wiring segments that intersect each other being connected by EPROM memory transistors,
circuitry connected to said series-pass transistors capable of selectively biasing said series-pass transistors to cause them to conduct or not to conduct.

26. In a programmable array logic circuit comprising a plurality of logic modules placed in an array, said logic modules each having connection nodes, a plurality of sets of wiring channels, each set of wiring channels having at least one wiring channel comprising at least two wiring segments, at least one of said wiring segments connected to at least one of said connection nodes, the wiring segments of at least one of the wiring channels being joined in series by series-pass transistors, at least two of said wiring segments in said logic circuit being joined in series by EPROM memory transistors, at least two of said wiring segments that intersect each other being connected by EPROM memory transistors, programming circuitry connected to the control elements of said series-pass transistors capable of selectively biasing said series-pass transistors to cause them to conduct or not to conduct, a method of programming selected ones of said EPROM memory transistors comprising the steps of:

(a) preselecting a group of series-pass transistors to be biased to conduct such that a first current path will exist from a source of a first potential to the sources of each of said selected EPROM memory transistors and a second current path will exist from a source of a second potential to the drains of each of said selected EPROM memory transistors when said preselected series-pass transistors are biased, (b) biasing said group of series-pass transistors to conduct, and (c) applying said first potential to the sources of each of said EPROM memory transistors, applying said second potential to the drains of each of said EPROM memory transistors, and applying said first potential to the control gates of each of said EPROM memory transistors.

27. In an integrated circuit, an electrically programmable interconnect architecture, comprising:
a plurality of modules placed in an array, the modules having connection nodes,
a plurality of sets of wiring channels, at least some o said sets of wiring channels having at least one wiring channel comprising at least two wiring segments and wherein at least one of said wiring segments is connected to at least one of said connection nodes,
a plurality of EEPROM memory transistors, each of said EEPROM memory transistors having a source and a drain, said source and said drain connected between selected ones of said wiring segments, each of said EEPROM memory transistors further including a control gate,
configuring means, connected to said sources, drains and control gates of said EEPROM memory transistors, for selectively rendering said EEPROM memory transistors conductive and nonconductive.

28. The electrically programmable interconnect architecture of claim 27 wherein at least one of said wiring channels lies in a direction substantially non-parallel to the remainder of said wiring channels and is disposed in a layer electrically isolated from the layer containing said remainder of wiring channels, forming intersections.

29. The electrically-programmable interconnect architecture of claim 28, further comprising:
EEPROM memory transistors joining selected ones of those wiring segments of said sets of wiring channels which intersect each other at said intersections.

30. The electrically-programmable interconnect architecture according to claim 27, further comprising:

series-pass transistors connecting selected adjacent and intersecting ones of said segments, and selection circuitry connected to the control element of each of said series-pass transistors capable of selectively biasing each one of said series-pass transistors to cause it to conduct or not to conduct.

31. A user-programmable array logic circuit, comprising:

a plurality of logic modules placed on a substrate, the logic modules each having connection nodes;

a plurality of first wiring channels running in a first direction, said first wiring channels containing at least two wiring segments, at least one said wiring segments connected to at least one of said connection nodes;

a plurality of second wiring channels running in a second direction and disposed in a layer electrically isolated from the layer containing said first wiring channels, said second wiring channels containing at least two wiring segments at least one of said wiring segments in said plurality of first wiring channels intersecting at least one of said wiring segments in said second plurality of wiring channels at intersections, a plurality of EEPROM memory transistors having sources and drains connecting at least one pair of the intersecting wiring segments.

32. The array logic circuitry according to claim 31 in which substantially all of said first and second wiring channels comprise a series of wiring segments of at least the smaller of the length or width of one logic module.

33. The array logic circuit according to claim 31 in which wiring segments of said first wiring channels have a length equivalent to the length of two logic modules and the wiring segments of said second wiring channels have a length equivalent to the width of three logic modules.

34. The array logic circuit according to claim 31, in which at least two of adjacent ones of said wiring segments forming a wiring channel are joined in series at their ends by series pass transistors having control elements.

35. The logic circuit according to claim 34 further comprising selection circuitry connected to the control element of each series-pass transistor in order to cause said series-pass transistor to conduct or not to conduct current between the wiring segments to which it is electrically connected.

36. The logic circuit according to claim 34 further comprising select transistors electrically connected to a middle wiring segment of each wiring channel which, when biased to conduct, connects the middle wiring segment to a selected potential.

37. The logic circuit according to claim 35 further comprising:

circuitry, connectable to selected ones of said wiring segments by said selection circuitry for providing preselected voltage to render conductive selected ones of said EEPROM memory transistors.

38. A programmable array logic circuit, comprising:

a plurality of logic modules placed in an array, said logic modules each having connection nodes, a plurality of sets of wiring channels, at least one of said wiring channels including a plurality of wiring segments, at least one of said wiring segments in said circuit connected to at least one of said connection nodes, at least one said wiring channels being in a direction substantially non-parallel to other ones of said wiring channels, the wiring segments of at least one of the wiring channels being joined in series by series-pass transistors, at least two of said wiring segments that intersect each other being connected by EEPROM memory transistors, circuitry connected to said series-pass transistors capable of selectively biasing said series-pass transistors to cause them to conduct or not to conduct.

39. In a programmable array logic circuit comprising a plurality of logic modules placed in an array, said logic modules each having connection nodes, a plurality of sets of wiring channels, at least one of said wiring channels including a plurality of wiring segments, at least one of said wiring segments in said circuit connected to at least one of said connection nodes, the wiring segments of at least one of the wiring channels being joined in series by series-pass transistors, at least two of said wiring segments of each wiring channel being joined in series by EEPROM memory transistors, at least two of said wiring segments intersecting each other and connected by EEPROM memory transistors, programming circuitry connected to the control elements of said series-pass transistors capable of selectively biasing said series-pass transistors to cause them to conduct or not to conduct, a method of rendering conductive a selected EEPROM memory transistor comprising the steps of:

(a) preselecting a group of series-pass transistors to be biased to conduct such that a first current path will exist from a source of a first potential to the sources of each of said selected EEPROM memory transistors and a second current path will exist from a source of a second potential to the drains of each of said selected EEPROM memory transistors when said preselected series-pass transistors are biased, (b) biasing said group of series-pass transistors to conduct, and (c) applying said first potential to the sources of each of said selected EEPROM memory transistors, applying said second potential to the drains of each of said selected EEPROM memory transistors, and applying said first potential to the control gates of each of said selected EEPROM transistors.

* * * * *